United States Patent
Ichikawa et al.

(10) Patent No.: US 9,893,250 B1
(45) Date of Patent: Feb. 13, 2018

(54) LIGHT EMITTING DEVICE HAVING SILICONE RESIN-BASED SEALING MEMBER

(71) Applicant: NICHIA CORPORATION, Anan-shi, Tokushima (JP)

(72) Inventors: Hirofumi Ichikawa, Tokushima (JP); Tomoki Tanisada, Anan (JP); Yasunori Shimizu, Tokushima (JP); Masafumi Kuramoto, Tokushima (JP)

(73) Assignee: NICHIA CORPORATION, Anan-Shi (JP)

( * ) Notice: Subject to any disclaimer, the term of this patent is extended or adjusted under 35 U.S.C. 154(b) by 0 days.

(21) Appl. No.: 15/382,011

(22) Filed: Dec. 16, 2016

(51) Int. Cl.
| | |
|---|---|
| *H01L 33/56* | (2010.01) |
| *H01L 33/38* | (2010.01) |
| *H01L 33/62* | (2010.01) |
| *H01L 33/48* | (2010.01) |
| *H01L 23/29* | (2006.01) |
| *H01L 23/31* | (2006.01) |

(52) U.S. Cl.
CPC .......... *H01L 33/56* (2013.01); *H01L 23/291* (2013.01); *H01L 23/3121* (2013.01); *H01L 33/38* (2013.01); *H01L 33/486* (2013.01); *H01L 33/62* (2013.01)

(58) Field of Classification Search
CPC .............................. H01L 23/18; H01L 23/298
See application file for complete search history.

(56) References Cited

U.S. PATENT DOCUMENTS

| | | | |
|---|---|---|---|
| 2006/0073347 A1 | 4/2006 | Morita et al. | |
| 2006/0170332 A1* | 8/2006 | Tamaki ................. | C09K 11/02 313/498 |
| 2011/0254047 A1* | 10/2011 | Yoshitake ............... | C08L 83/04 257/100 |
| 2014/0183574 A1 | 7/2014 | Nakabayashi et al. | |

FOREIGN PATENT DOCUMENTS

| | | |
|---|---|---|
| JP | 2015-209481 A | 11/2015 |
| WO | WO 2015/030224 A1 | 3/2015 |

* cited by examiner

*Primary Examiner* — Cheung Lee
(74) *Attorney, Agent, or Firm* — Foley & Lardner LLP (57) ABSTRACT

A light emitting device includes at least one light emitting element including a plurality of semiconductor layers; and a light transmissive sealing member covering the at least one light emitting element. The light transmissive sealing member comprises a light transmissive sealing resin containing a silicone resin having a siloxane bond scaffold having methyl and phenyl groups as a principal ingredient. The light transmissive sealing resin has a refractive index in a range between 1.45 and 1.52, a durometer type D hardness at 25° C. specified by JIS K 6253 in a range between 20 and 70, and a DMA tan δ-based glass transition temperature (Tg) in a range between 20° C. and 70° C.

15 Claims, 3 Drawing Sheets

LIGHT EMITTING DEVICE HAVING SILICONE RESIN-BASED SEALING MEMBER

BACKGROUND

The present disclosure relates to a light emitting device. WO201503022A1 discloses a semiconductor light emitting device employing a silicone composition which has a high refractive index and low gas permeability.

SUMMARY

Further increases in the output of light emitting devices that employ semiconductor light emitting elements are in demand, and light emitting devices will be required to be operated under harsher conditions in the future. The harsher operating conditions refer to, for example, driving a light emitting device at a higher input current than before.

At the same time, further size reductions of light emitting devices are also in demand.

Driving a light emitting device at a higher input current than the conditions for conventional light emitting devices will likely cause cracks to develop in sealing resins, which has not been a problem under the past service conditions. Such cracks are believed to be at least partially attributable to degradation causing increased hardness of sealing resins employed in light emitting devices being subjected to the light emitted and the heat generated by semiconductor light emitting elements.

Certain embodiments of the invention provide light emitting devices that are highly reliable even when driven under harsher conditions.

A light emitting device according to one embodiment of the present invention comprises: a light transmissive sealing member comprising a light transmissive sealing resin containing, a silicone resin having a siloxane bond scaffold having methyl and phenyl groups as a principal ingredient, and having a refractive index in a range between 1.45 and 1.52, a durometer type D hardness at 25° C. specified by JIS K 6253 in a range between 20 and 70, and a DMA tan δ-based glass transition temperature (Tg) in a range between 20° C. and 70° C., and a light emitting element including semiconductor layers and covered by the sealing resin.

DESCRIPTION

Certain embodiments of the present invention will be explained below with reference to drawings. The light emitting devices explained below, however, are provided to embody the technical ideas of the present invention. As such, unless otherwise specifically noted, the present invention is not limited to those described below. The description of one embodiment or example is applicable to other embodiments or examples. The sizes of and positional relationships between the components shown in each drawing might be exaggerated for the clarity of the explanations.

Embodiment 1

Figure 1A:
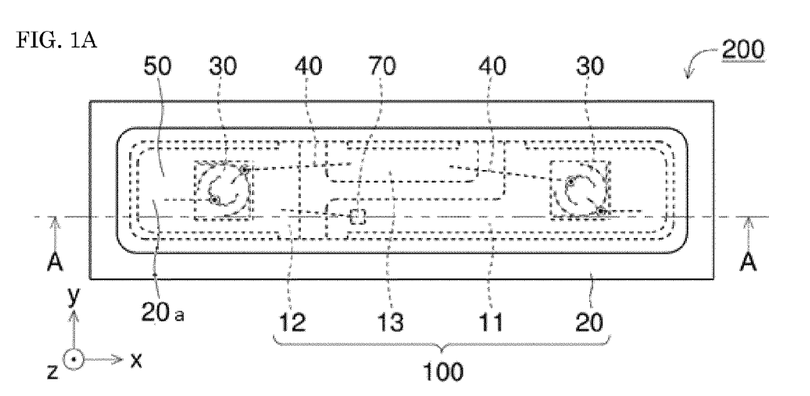
FIG. 1A is a schematic top view of the light emitting device according to one embodiment of the present invention.
Figure 1B:
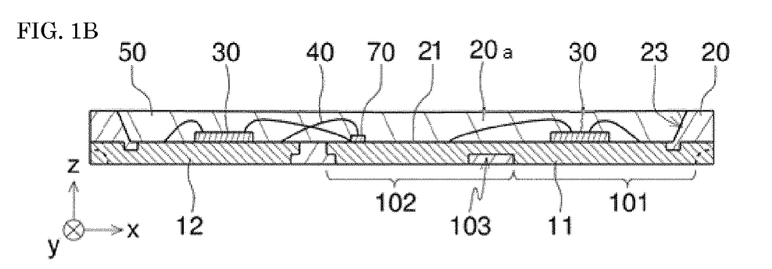
FIG. 1B is a schematic sectional view of the light emitting device along line A-A in FIG. 1A.
Figure 1C:
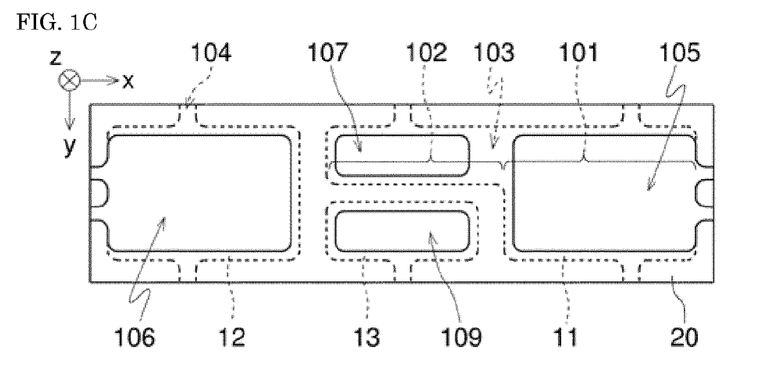
FIG. 1C is a schematic bottom view of the light emitting device shown in FIG. 1A.

FIGS. 1A and 1C are schematic top and bottom views of the light emitting device according to Embodiment 1, respectively, and FIG. 1B is a schematic sectional view along line A-A shown in FIG. 1A. As shown in FIG. 1, the light emitting device 200 according to Embodiment 1 primarily includes light emitting elements 30 mounted on the cavity bottom surface 21 of the cavity 20a of the resin package 100, and a sealing member 50 which seals the light emitting elements 30.

The sealing resin used in the sealing member 50 of the light emitting device according to Embodiment 1 satisfies that it has a refractive index in a range between 1.45 and 1.52, a durometer type D hardness at 25° C. specified by JIS K 6253 in a range between 20 and 70, a DMA tan δ-based glass transition temperature (Tg) in a range of 20° C. and 70° C., and a silicone resin as a principal ingredient having a siloxane bond scaffold having methyl and phenyl groups, and as well as being a light transmissive member.

As used herein, a sealing resin having silicone resin as a principal ingredient refers to, for example, a sealing resin in which an amount of the silicone resin is preferably at least 90% by weight, more preferably at least 95% by weight.

The sealing resin of the sealing member 50 of Embodiment 1 will be explained in detail below.

Refractive Index

The refractive index of the sealing resin in Embodiment 1 falls in a range between 1.45 and 1.52.

A sealing resin having a refractive index in the above range reduces degradation of the sealing resin and the likelihood for cracks to occur in the sealing member in the light emitting device operated at an increased input current, thereby increasing the reliability of the light emitting device.

The refractive index of the sealing resin was measured using an Abbe refractometer manufactured by ATAGO Co., Ltd., Model No. 2T, at room temperature (25° C.) and the wavelength of the sodium D line at 589 nm.

The refractive index of the sealing resin herein refers to the refractive index of the sealing resin while it is in the liquid state, i.e., before curing. The refractive index of the cured sealing resin is higher by, for example, about 0.01 than that of the liquid state.

Hardness

The hardness of the sealing resin of Embodiment 1 is such that the durometer type D hardness specified by JIS K 6253 falls in a range between 20 and 70. References to the JIS K 6253 standard in this application refer to the standard at the time this application was filed. A sealing resin having a type D hardness of 20 or higher reduces tackiness of the sealing resin, thereby improving the ease of handling of the light emitting device. A sealing resin having a type D hardness of 70 or lower can reduce the occurrences of cracks. The hardness of the sealing resin was measured by setting a durometer manufactured by TECLOCK Corporation, Model No. GS-720HTYPED, on a durometer stand, Model No. GS-610.

Glass Transition Temperature (Tg)

The sealing resin of Embodiment 1 has a DMA tan δ-based glass transition temperature (Tg) specified by JIS standards in a range between 20° C. and 70° C. A sealing resin having a glass transition temperature (Tg) in the above range can reduce the likelihood for the wires and the like connected to the light emitting elements to break due to a thermal shock, thereby improving the reliability of the light emitting device.

The glass transition temperature (Tg) of the sealing resin was measured using a DMA apparatus manufactured by Hitachi High-Tech Science Corporation, Model No. DMS6100. The measurements were made at temperatures of from −100° C. to 300° C., at a rate of increase of 2° C./minute, under tension mode, and at a 5 Hz frequency, assuming the peak temperature of tan δ (loss modulus/ storage modulus) being Tg.

Light Transmissivity

The sealing resin of Embodiment 1 has light transmissivity. Light transmissivity refers to, for example, a transmittance for the peak emission wavelength of the light emitting element of 70% or higher.

Next, the structure of the silicone resin, which is a principal ingredient of the sealing resin of Embodiment 1, will be explained.

A silicone resin having a siloxane bond scaffold having methyl and phenyl groups used in Embodiment 1 is a curable resin composition having, for example, a siloxane bond in a straight chain and/or branched structure where methyl, phenyl, and functional groups are attached to silicon atoms, as its scaffold expressed by Chemical Formula 1 below. The curing reaction mechanism may be an addition reaction, a condensation reaction, or a UV initiated radical reaction, but is preferably an addition reaction. As compared to other methods, unreacted residues barely remain in addition curing, thereby reducing the chances of the cured resin increasing the hardness over time. This reduces the likelihood of cracks attributable to increased hardness of the sealing resin occurring, thereby improving the reliability of the light emitting device. In the case of an addition reaction, the resin composition is composed at least of a component having two or more alkenyl groups, e.g., vinyl group and a component having two or more hydrogen atoms per molecule as the functional groups to bond with silicon atoms. The resin composition may also be composed of a hydrosilylation reaction catalyst.

[Chemical Formula 1]

Addition Reaction

[Chemical Formula 2]

Condensation Reaction

[Chemical Formula 3]

In the formulas above, R is a methyl group, a phenyl group, a functional group, or the like, and $R_1$ is an alkoxy group, or the like.

The sealing resin normally contains, besides the silicone resin described above, a small amount, for example, about 5% or less, of additives such as a coupling agent.

As shown in FIG. 1, the resin package 100 as viewed from above has a shape with a long dimension in one direction. Namely, when viewed from above, the resin package 100 has a longitudinal direction and a transverse direction perpendicular to the longitudinal direction. More specifically, the longitudinal direction is the direction parallel to the lead-frame resin package sides that extend in the long direction, which are the outer surfaces of the resin package normal to the transverse direction, as viewed from above. In FIG. 1, the longitudinal direction is the x-direction, the transverse direction is the y-direction, and the up and down direction is the z-direction. Accordingly, the x-direction is the length direction, the y-direction is the width direction, and the z-direction is the thickness (height) direction. These directionality designations are also applicable to light emitting devices for other embodiments described below.

The resin package 100 shown in FIG. 1 includes two lead-frames 11, 12, and a resin portion 20 integrated with the two lead-frames. More specifically, a third lead-frame 13 is provided between the two lead-frames 11, 12 and the resin portion 20 is integrated with the three lead-frames 11, 12, 13. The two lead-frames 11, 12 are lined-up in the longitudinal direction of the resin package 100. Each of the lead-frames 11, 12, 13 is shaped with a long dimension in the longitudinal direction (x-direction) similar to the shape of the resin package 100. The lead-frames 11, 12, 13 have a sheet form with practically no processing such as bending or folding implemented. At least two lead-frames 11, 12, and more specifically, the three lead-frames 11, 12, 13, are integrally held by the resin portion 20 which fills the gaps that separate the lead-frames from one another and used as electrical insulation regions. At least parts of the bottom faces of the three lead-frames 11, 12, 13 are exposed from the resin portion 20, and together with the resin portion 20 form the bottom face of the resin package 100, i.e., the bottom face of the light emitting device 200. This achieves a resin package 100 with good mounting characteristics using a conductive paste and good heat dissipation characteristics.

Two light emitting elements 30 rectangular in shape when viewed from above are mounted on the cavity bottom surface 21 of the resin package 100, and the electrodes of each light emitting element 30 and the lead-frames 11, 12, 13 are connected using wires 40.

In the resin package 100, the lead-frame on the right side is referred to as a first lead frame 11, the lead-frame on the left side is referred to as a second lead-frame 12, and the lead-frame between them is referred to as a third lead-frame 13 in the explanation below.

The resin portion 20, as viewed from above, has a rectangular shape that extends in the longitudinal direction (x-direction) of the resin package. The resin portion 20 covers the end faces of the two lead-frames 11, 12, more specifically the three lead-frames 11, 12, 13, except for the suspension leads 104. The resin portion 20 covers part of the upper faces of the two lead-frames 11, 12, more specifically the three lead-frames, 11, 12, 13, particularly the peripheral portions.

Furthermore, the resin portion 20 together with the two lead-frames 11, 12, more specifically the three lead-frames 11, 12, 13, forms a cavity 20a to hold the light emitting elements. Specifically, the bottom surface 21 of the cavity is formed by the upper faces of the lead-frames 11, 12, 13 and the surface of the resin portion 20. The side-wall surfaces, i.e., interior surfaces of the side-walls 23 of the cavity, are structured by the surfaces of the resin portion 20. Although the side-wall faces of the cavity, the interior faces of the side-walls 23, can be vertical, oblique side-wall faces that reduce the size of the cavity opening towards the cavity bottom surface 21 are preferable for efficiently extracting the light emitted by the light emitting elements. Here, an example of a package with a cavity 20a is exemplified, but it is also possible, for example, to make a flat sheet-formed resin package with no cavity, i.e., no side-walls 23. This similarly applies to other embodiments described below.

As shown in FIG. 1A, the top view shape of the cavity 20a can be similar to the shape of the resin package 100.

The light transmissive sealing member 50 that covers the light emitting elements 30 is disposed in the cavity 20a. The sealing resin included in the sealing member 50 has the characteristics described above.

The light emitting device 200 constructed as above can have improved reliability.

Because the first lead-frame 11 has an extension 102 extending towards the second lead-frame 12, wires 40 from the light emitting elements 30 and protection device 70, or the protection device 70 itself, can be attached to the upper face of the extension 102. This allows the wires 40 to be relatively short, thereby making the wires 40 less susceptible to disconnections.

A preferable embodiment of the light emitting device 200 will be explained below.

As shown in FIG. 1, the light emitting device 200 includes a resin package 100 and light emitting elements 30, 30 mounted on the upper faces of the first and second lead-frames 11, 12, respectively. By mounting light emitting elements 30 on each of the first and the second lead-frames 11, 12, the separation between the two light emitting elements 30 can be made relatively large, thereby increasing the light extraction efficiency. Moreover, the area of the sealing resin subject to the light from both of the light emitting elements 30 can be reduced. This reduces the deterioration of the sealing resin attributable to light, as well as reducing the likelihood of increasing the hardness of the sealing resin and the sealing member, thereby reducing the occurrences of cracks.

As shown in FIG. 1, the light emitting device 200 is provided with a protection device 70 mounted on the upper surface of the extension 102 of the first lead-frame. The protection device 70 is connected to the upper face of the second lead-frame 12 using a wire 40. As such, the first lead-frame's extension 102 can be suitably utilized for mounting the protection device 70. By mounting the protection device 70 on the upper surface of the first lead-frame's extension 102, the spacing between the light emitting elements 30 and the protection device 70 can be easily increased. This reduces the amount of light absorbed by the protection device 70, thereby increasing the light extraction efficiency. Moreover, since the wire 40 connecting the protection device 70 and the second lead-frame 12 can be made relatively short, absorption of light by the wire 40 can be reduced, thereby further increasing the light extraction efficiency.

Each constituent element of the light emitting device according to the present embodiment will be explained below.

Lead-Frames 11, 12, 13

Lead-frames are electrically connected to light emitting elements, and the light emitting device is provided with at least a pair of lead-frames. Metal materials that can conduct electricity and can be connected with the light emitting elements and protection device can be used as the lead-frames. Specifically, metals such as copper, aluminum, gold, silver, tungsten, iron (steel), nickel, cobalt, molybdenum, alloys of these metals, copper-iron alloy, and phosphor bronze can be used in sheet metal form processed by various methods such as press-forming, etching, and metal rolling. In addition, metal plating or light reflecting thin-film can be established on the surface of those metals with materials such as silver, aluminum, rhodium, gold, copper, and their alloys. Among those materials, silver, which has the best light reflecting characteristics, is preferable. Although lead-frame thickness can be freely selected, it can be, for example, in a range between 0.1 mm and 1 mm, and preferably in a range between 0.2 mm and 0.4 mm. As shown in FIG. 1-3, for example, grooves and recesses can be formed in perimeter regions of the upper and lower surfaces of the lead-frames that make contact with the resin portion. This can restrain the ingress of ambient moisture and/or flux included in the conductive adhesive from the lower faces of the lead-frames, and can improve intimate contact between the resin portion and the lead-frames.

Resin Portion 20

The base material for the resin portion can be a thermosetting resin such as polybismaleimide-triazine resin, epoxy resin, silicone resin, denatured silicone resin, silicon-modified resin, polyimide resin, polyurethane resin, unsaturated polyester rosin, or diallyl phthalate resin. Or, the base material can be a thermoplastic resin such as aliphatic polyamide resin, semi-aromatic polyamide resin, polyethylene terephthalate, polycyclohexane terephthalate, liquid crystal polymer, polycarbonate resin, syndiotactic polystyrene, polyphenylene ether, polyphenylene sulfide, polyethersulfone resin, polyether-ketone resin, or polyarylate resin. In addition, particulate or fiber fillers and pigments such as glass, silica, titanium oxide, magnesium oxide, magnesium carbonate, magnesium hydroxide, calcium carbonate, calcium hydroxide, calcium silicate, magnesium silicate, wollastonite, mica, zinc oxide, barium titanate, potassium titanate, aluminum borate, aluminum oxide, silicon carbide, antimony oxide, zinc stannate, zinc borate, iron oxide, chrome oxide, manganese oxide, and carbon black can be mixed into the base material.

Light Emitting Elements 30

Light emitting semiconductor devices, such as light emitting diodes (LEDs) and semiconductor laser diodes, can be used as the light emitting elements. A light emitting element can be any of a variety of semiconductor structures equipped with an emission region having an active layer, and configured with a pair of positive and negative electrodes. In particular, nitride semiconductor light emitting elements (e.g., $In_xAl_yGa_{1-x-y}N$, $0 \leq x$, $0 \leq b$, $x+y \leq 1$) that can efficiently excite a wavelength conversion material (fluorescent material) are preferable. In addition, the light emitting elements can be gallium arsenide based or gallium phosphide based semiconductors that emit light from green to red wavelengths. For light emitting elements with the positive and negative electrodes established on the same side of the chip, the chip is mounted with the electrode surface up and with wires connecting each electrode to a lead-frame, or flip chip mounted by having each electrode oppose a lead-frame to be connected. For light emitting elements with an opposing electrode structure having electrodes established on the top and bottom surfaces of the chip, the bottom side electrode is connected to a lead-frame via a conductive adhesive and the upper surface electrode is connected to a lead-frame via a wire. A similar mounting configuration applies to the production device described later. Moreover, light extraction efficiency can be improved by establishing a metal layer such as silver or aluminum, or a light-reflecting dielectric layer on the die-attachment surface side of the light emitting elements. A single light emitting element or a plurality of light emitting elements can be mounted in a single light emitting device, and the size, shape and light emission wavelength of the light emitting elements can be selected freely.

When the peak emission wavelength of a light emitting element is in a range between 380 nm and 500 nm, high-energy short wavelength light is irradiated against the sealing resin, accelerating the progression of degradation and increasing the likelihood for the sealing member to develop cracks. This embodiment, therefore, can effectively be applied.

A plurality of light emitting elements can be connected in series or parallel via the lead-frames and/or wires. Furthermore, a single light emitting device can include a combination of different wavelength light emitting elements, such as one blue light emitting element and one red light emitting element (two elements), one blue light emitting element and one green light emitting element (two elements), or one blue light emitting element, one green light emitting element, and one red light emitting element (three elements).

The light emitting device according to this embodiment is preferably designed so that the current density J ($A/cm^2$) is 12 or higher when 120 mA is supplied to the light emitting elements. Driving the light emitting elements at such a relatively high current density tends to facilitate the progression of deterioration of the sealing resin, increasing the likelihood for the sealing member to develop cracks. This embodiment, therefore, can effectively be applied.

The area of the emission region of the semiconductor layers of the light emitting element as viewed from above is preferably 1 $mm^2$ or less. This achieves a small sized and inexpensive light emitting element, and can reduce the price of the light emitting device. Extracting a relatively large amount of light from a light emitting device by utilizing such relatively small light emitting elements tend to increase the current density for the light emitting elements, increasing the likelihood for the sealing member to have cracks as described above. This embodiment, therefore, can effectively be applied.

Wires 40

The wires are conducting wires that connect light emitting element and protection device electrodes with the lead-frames. Specifically, metal wires made of gold, copper, silver, platinum, aluminum, or their alloys can be used. Gold wire, in particular, which can withstand stress applied by the sealing member and has good thermal resistance, is preferable. Furthermore, in order to improve light reflection, the wires can be configured with silver at least on their surfaces.

Preferably, as shown in FIG. 1A, the resin package has a rectangular shape having a longitudinal direction and a transverse direction as viewed from above, the light emitting elements have a rectangular shape as viewed from above, the electrodes of the light emitting elements are positioned at the corners of the upper faces of the light emitting elements, and the wires are extended from the corners of the light emitting elements in a direction away from the light emitting elements along the longitudinal direction of the resin package. With this configuration, the wires can be positioned away from the areas immediately above the light emitting elements where cracks easily occur which cause the wire to break, thereby improving the reliability of the light emitting device. When the resin package, and more specifically the cavity of the resin package, has a longitudinal direction and a transverse direction as viewed from above, cracks are likely to occur in the sealing member immediately above the light emitting elements so as to extend in the transverse direction of the light emitting device. Accordingly, the structure described above, in which the wires are positioned away from the areas susceptible to crack formation, can improve the reliability of the light emitting device.

Sealing Member 50

The sealing member seals and protects the light emitting elements, the protection device, and the wires from dust, moisture, and external forces.

The sealing member may contain in its base material particles having various functions, such as a filler and a wavelength conversion material (fluorescent material). For the filler, a light diffusion agent, a coloring agent, or the like can be used. Specific examples include silica, titanium oxide, magnesium oxide, magnesium carbonate, magnesium hydroxide, calcium silicate, calcium carbonate, calcium hydroxide, calcium silicate, zinc oxide, barium titanate, aluminum oxide, iron oxide, chrome oxide, manganese oxide, glass, and carbon black. The particle shape of the filler can be a crushed shape or a spherical shape. Moreover, the filler can be hollow or porous.

The sealing member of the light emitting device in this embodiment preferably contains a fibrous filler. The fibrous filler is preferably localized or settled on the cavity bottom surface side and at least near the upper face of the light emitting elements. This can reduce cracks that extend from the upper portion, particularly corners of the upper faces of the light emitting elements, thereby increasing the reliability of the light emitting device.

Such fillers can be localized on the cavity bottom surface side by applying a centrifugal force to the filler-containing sealing member after being introduced into the cavity of the resin package while it is in the liquid state prior to curing.

For the fibrous filler, for example, glass fibers having a diameter in a range between about 8 μm and about 20 μm, and an average length in a range between about 20 μm and 50 μm can be used. Examples of the glass materials include alumina borosilicate glass.

The amount of the fibrous filler in the sealing member can be, for example, in a range of about 5% by weight to about 30% by weight When the thickness of the sealing member is relatively thin, about 350 μm or less from the upper face of the light emitting device, the progression of cracks in the sealing member can be facilitated. This embodiment which can reduce the occurrences of cracks in the sealing member, therefore, can be effectively applied.

Wavelength Conversion Material (Fluorescent Material 260a)

The wavelength conversion material (fluorescent material) absorbs at least a portion of the primary light emitted from the light emitting elements and emits the secondary light having a different wavelength than that of the primary light. Examples of fluorescent materials include nitride-based phosphors and oxynitride-based phosphors primarily activated by an element of the lanthanide series, such as europium and cerium, more specifically, a europium-activated α- or β-SiAlON phosphor, various alkaline earth metal nitridosilicate phosphors; alkaline earth metal halogen-apatite phosphors, alkaline earth halosilicate phosphors, alkaline earth metal silicate phosphors, alkaline earth metal halogen borate phosphors, alkaline earth metal aluminate phosphors, alkaline earth metal silicates, alkaline earth metal sulfides, alkaline earth metal thiogallate, alkaline earth metal silicon nitride, and germanates primarily activated by an element of the lanthanide series, such as europium, or a transition metal, such as manganese; rare earth aluminates and rare earth silicates primarily activated by an element of the lanthanide series such as cerium; and organic materials or organic complexes primarily activated by an element of the lanthanide series. Fluorescent materials other than those listed above, but having similar functionality and effect can also be used. This can achieve a light emitting device that outputs light, for example, white light, resulting from color mixing of the primary light and the secondary light of visible wavelengths, or a light emitting device with a fluorescent material excited by ultraviolet primary light that outputs visible wavelength secondary light. The fluorescent material can be settled towards the cavity bottom surface of the resin package or dispersed in the cavity.

When the sealing member effectively contains no wavelength conversion material, the light from the light emitting elements is irradiated against the sealing resin without being converted to a longer wavelength. This accelerates the deterioration of the sealing resin and facilitates the progression of crack formation. This embodiment which can reduce the occurrences of cracks in the sealing member can therefore be effectively applied.

When the sealing member contains a small amount of a wavelength conversion material, and the chromaticity of the light emitting device is, for example, x=0.23 or lower and y=0.23 or lower, most of the light from the light emitting elements is irradiated against the sealing resin without being converted to a longer wavelength. This accelerates the deterioration of the sealing resin and facilitates the progression of crack formation. This embodiment which can reduce the occurrences of cracks in the sealing member can therefore be effectively applied.

The amount of the wavelength conversion material in the sealing member can be, for example, in a range of about 10% by weight to about 50% by weight.

Protection Device 70

The protection device protects the light emitting elements from static electricity and high-voltage surges. Specific examples include a Zener diode. The protective device can be covered with a reflective material, such as a white resin, in order to reduce light absorption.

EXAMPLES

Examples according to a certain embodiment of the invention will be explained in detail. It should go without saying that the present invention is not limited to the examples described below.

The light emitting devices having the structures described below were produced as Example 1, Example 2, Comparative Example 1, and Comparative Example 2.

These light emitting devices are top-view, surface mount device (SMD) light emitting diodes (LEDs) having the structure similar to the light emitting device 200 example shown in FIG. 1.

The resin package 100 of Example 1 has a shape of a rectangular parallelepiped 7.0 mm in length, 2.0 mm in width, and 0.6 mm in thickness. The resin package 100 has first and second lead-frames 11, 12 that constitute the positive and negative electrodes, and a third lead-frame 13 between these lead-frames integrally formed with the resin portion 20. Resin packages 100 are fabricated by loading a pre-processed metal sheet, which has multiple sets of lead-frames 11, 12, 13 connected by suspension leads (which become suspension leads 104 after being separated into pieces) in a two-dimensional array, inside a mold cavity, introducing a liquid material that forms the resin portion 20 into the mold cavity, hardening the material, demolding, and separating into individual resin packages 100.

Each of the three lead-frames 11, 12, 13 is a small piece of copper alloy sheet with a silver-plated surface 0.3 mm in thickness at maximum. The first lead-frame 11 is primarily made up of a rectangular main body 101, as viewed from above, which is 2.0 mm in length and 1.5 mm in width (excluding the suspension leads 104), and a rectangular extension 102, as viewed from above, which is 2.0 mm in length and 0.6 mm in width (excluding the suspension leads 104) extending from the main body 101 towards the second lead-frame 12. The extension 102 is disposed on one side in the transverse direction of the main body 101 to give the first lead-frame 11 an L-shape when viewed from above. The second lead-frame 12 is formed in a rectangular shape, as viewed from above, of 2.0 mm in length and 1.5 mm in width (excluding the suspension leads 104). The third lead-frame 13 is disposed opposite the extension 102 of the first lead-frame 11 in the transverse direction, and is formed in a rectangular shape, as viewed from above, of 1.8 mm in length and 0.6 mm in width (excluding the suspension lead 104). The distance of the gap between the extension 102 of the first lead-frame 11 and the second lead-frame 12 in the longitudinal direction is 0.5 mm. The distance between the main body 101 of the first lead-frame 11 and the third lead-frame 13 in the longitudinal direction is 0.5 mm. The distance of the gap between the extension 102 of the first lead-frame 11 and the third lead-frame 13 in transverse direction is 0.4 mm. These gaps were punched out by a punch press. A recess 13 of 0.5 mm in length, 0.6 mm in width, and 0.15 mm in depth is created in the bottom face of the extension 102 of the first lead frame 11 immediately adjacent to the main body 101. The recess 13 is filled with the resin portion 20. The resin portion 20 filling the recess 103 separates essentially the entire exposed area 107 of the bottom face of the extension from the exposed area 105 of the bottom face of the main body of the first lead-frame 11. Moreover, recesses of 0.12 mm in width and 0.09 mm in depth are formed along part of the perimeters of the bottom faces of the first and second lead-frames 11, 12 and around the entire perimeter of the bottom face of the third lead-frame 13. These recesses were formed by etching. The exposed areas of the bottom faces of the three lead-frames are effectively coplanar with the bottom face of the resin portion 20, and form the bottom face of the resin package 100. Each of the exposed areas of the bottom faces of the three lead-frames has a rectangular shape with rounded corners. The first and second lead-frames 11, 12 are exposed in part (one of the suspension leads 104 of each lead-frame) at the end faces of the resin package 100 in the longitudinal direction.

The resin portion 20 is epoxy resin containing titanium oxide molded into a rectangular outer shape in a top view which is 7.0 mm in length, 2.0 mm in width, and 0.60 mm in thickness at maximum. A cavity 20a having a rectangular shape with rounded corners when viewed from above, which is 6.4 mm in length, 1.4 mm in width, and 0.35 mm in depth, is formed approximately in the center of the upper face of the resin portion 20. The side-wall faces of the cavity 20a are inclined 5° and 30°. Grooves of 0.12 mm in width and 0.09 mm in depth are formed along parts of the boundaries between the cavity bottom surface 21 and the side-wall surfaces, and the grooves are also filled with the resin portion 20.

A light emitting element 30 is mounted on the upper face of each of the first and second lead-frames 11, 12 using a silicone resin insulating adhesive. The light emitting element 30 is a nitride semiconductor LED element, 650 µm in length, 650 µm in width, and 150 µm in thickness, having an n-type layer, an active layer, and a p-type layer successively stacked on a sapphire substrate, capable of emitting blue light (with the center wavelength of 450 nm). The distance between the two light emitting elements 30 is 4.0 mm. One of the electrodes (p or n) of each light emitting element 30 is connected via a wire 400 to the lead-frame on which the element is mounted on, and the other (p or n) electrode is connected via a wire 40 to the upper face of the third lead-frame 13. This connects the two light emitting elements 30 in series. The wire 40 is a 25 µm diameter gold wire.

A Zener diode protection device 70, 150 µm in length, 150 µm in width, and 85 µm in thickness which has an opposing electrode structure, is bonded on the upper face of the extension 102 of the first lead-frame 11 using a silver paste conductive adhesive. The upper surface electrode of the protection device 70 is connected to the upper face of the second lead-frame 12 using a wire 40.

Example 1

The sealing member 50 used in Example 1 contains a light transmissive resin containing, as a principal ingredient, silicone resin with a siloxane bond scaffold having methyl and phenyl groups.

It is specifically, for example, a cured resin composition having, as its scaffold expressed by the general formula shown as [Chemical Formula 1], a siloxane bond of a straight chain and/or branched structure having methyl, phenyl, and functional groups. Table 1 below shows the refractive index, the D hardness after curing, and the Tg after curing of the sealing resin used in Example 1.

The sealing member 50 used in Example 1 contains an amorphous silica filler, but does not contain a wavelength conversion material.

Example 2

For the sealing resin, a different material than that used in Example 1, but prepared in a similar manner, was used.

Comparative Example 1

For the sealing resin, a different material than those used in Examples 1 and 2, but prepared in a similar manner, was used. Since the sealingresin used in Comparative Example 1 has a large amount of phenyl group as compared to Examples 1 and 2, the refractive index is high.

Comparative Example 2

For the sealing resin, a different material than those used in Example 1, Example 2, and Comparative Example 1, but prepared in a similar manner, was used. Since Comparative Example 2 has a lower crosslinking density as compared to Examples 1 and 2, the glass transition temperature Tg is low.

Table 1 below shows the refractive indices, hardness, glass transition temperatures of the sealing resin in the sealing member in Examples 1 and 2, and Comparative Examples 1 and 2.

TABLE 1

| | Refractive Index | D Hardness | Tg (° C.) |
| --- | --- | --- | --- |
| Example 1 | 1.50 | 48 | 45 |
| Example 2 | 1.51 | 49 | 37 |
| Comparative Example 1 | 1.54 | 46 | 43 |
| Comparative Example 2 | 1.50 | 20 | −35 |

Liquid phase-type thermal shock tests were conducted on the light emitting devices of Examples 1 and 2, and Comparative Example 1. Accelerated life tests were also conducted on the light emitting devices of Examples 1 and 2, and Comparative Example 1.

The results are shown below.

For the liquid phase-type thermal shock tests, 20 light emitting devices were prepared for each example, which were tested under the conditions of 2100 cycles of from −40° C. to +100° C.

For the accelerated life tests, 3 light emitting devices were prepared for each example and operated for 1000 hours under the conditions: input power to the light emitting devices was 2.1 W, current value of the light emitting devices was 350 mA, current density per light emitting element was 82.8 A/cm$^2$ when calculated using the top view area of the light emitting element and 98.7 A/cm$^2$ when calculated using the top view area of the emission region of the light emitting element.

TABLE 2

| | Liquid Phase-type Thermal Shock Test | Accelerated Life Test |
| --- | --- | --- |
| Example 1 | No failures | No cracks |
| Example 2 | No failures | No cracks |
| Comparative Example 1 | No failures | Cracks occurred |
| Comparative Example 2 | (Estimated to fail) | — |

The light emitting devices of Examples 1 and 2 produced good results in both liquid phase thermal shock tests and accelerated life tests.

With respect to the light emitting devices of Comparative Example 1, however, cracks developed in the sealing member of one light emitting device after 500 hours in the accelerated life test.

Because the glass transition temperature of the sealing resin used in the light emitting devices of Comparative Example 2 was −35° C., which was lower than room temperature, they were estimated to fail in liquid phase-type thermal shock tests, as the wires would not be able to withstand the thermal stress applied by the sealing member and break.

From the accelerated life test results described above, estimation can be made that cracks would develop in the sealing member of the light emitting device of Comparative Example 1, but no cracks would develop in the sealing members of the light emitting devices of Examples 1 and 2 when driving the light emitting devices having similar structures to those in Examples 1 and 2, and Comparative Example 1 for 13000 hours at 25° C., and a current density of the light emitting elements of 33.8 A/cm² when calculated using the top view area of an emission region of the semiconductor layers.

Example 3

Figure 2A:
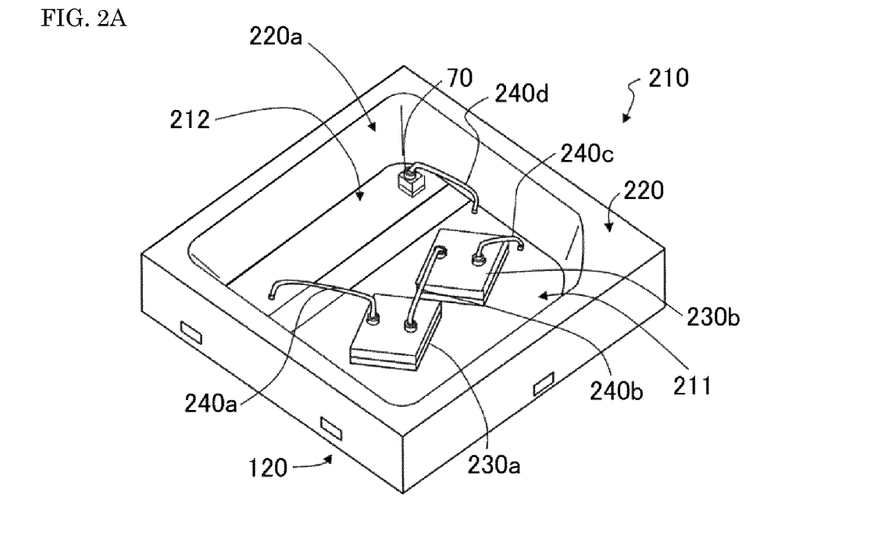
FIG. 2A is a schematic perspective view of the light emitting device according to another embodiment of the present invention.
Figure 2B:
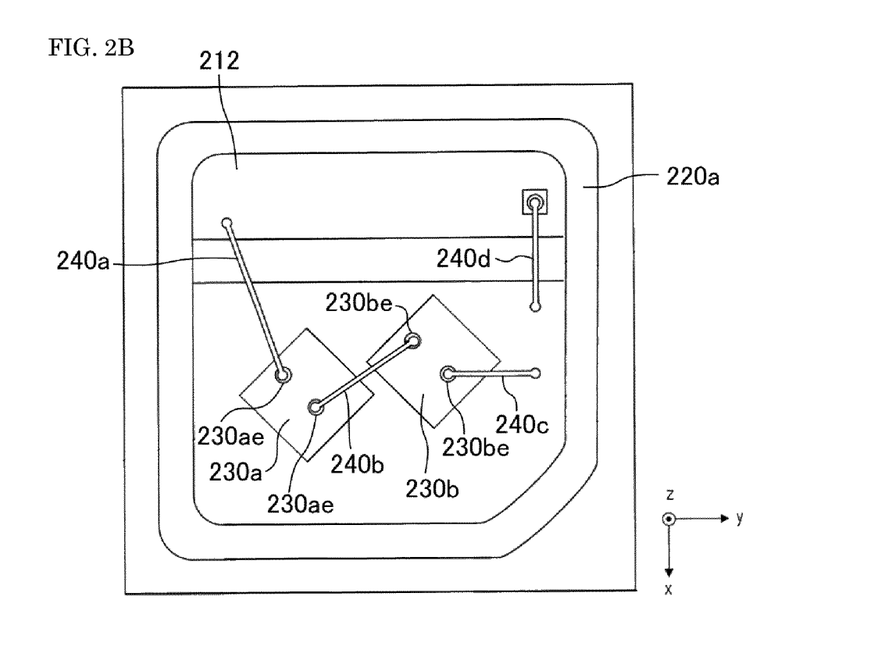
FIG. 2B is a schematic upper view of the light emitting device shown in FIG. 2A.
Figure 2C:
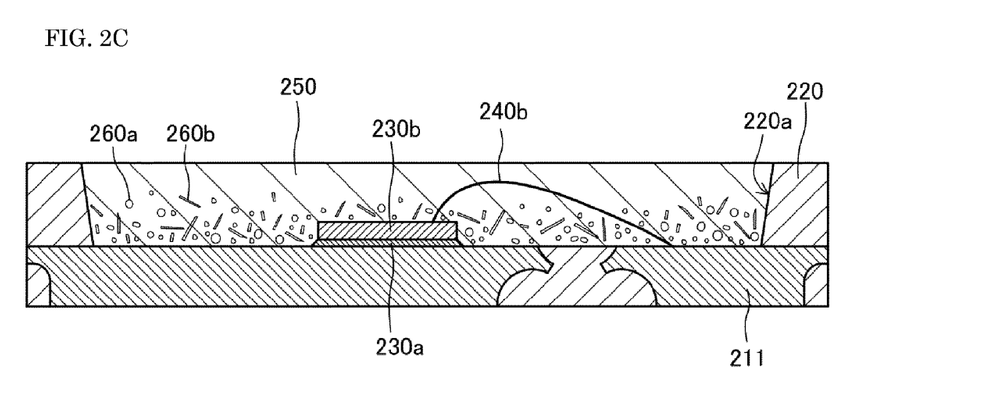
FIG. 2C is a schematic sectional view of the light emitting device shown in FIG. 2A.

FIG. 2A is a schematic perspective view, FIG. 2B is a schematic top view, and FIG. 2C is a schematic sectional view of the light emitting device according to Example 3. As shown in FIGS. 2A-2C, the light emitting device 210 according to Embodiment 2 primarily includes two light emitting elements 230a and 230b positioned in the cavity 220a of the resin package having a pair of lead-frames 211 and 212 exposed at the bottom face of the resin portion 220, and sealed by a sealing member 250 includes a sealing resin having a silicone resin as a principal ingredient similar to that in Example 1. The sealing member 250 in this example contains fluorescent materials 260a containing YAG and SCASN phosphors, a nano-silica filler, and a fibrous filler 260b made of an alumina borosilicate glass material. The densities of the fluorescent materials 260a and the fibrous filler 260b, as shown in FIG. 2C, are lower towards the upper face of the sealing member 250, i.e., they are localized near the upper faces of the light emitting elements and on the cavity bottom surface side. Electrodes 230ae and 230be of the two light emitting elements 230a and 230b are electrically connected to the lead-frames 211 and 212 by wires 240a, 240b, and 240c respectively. A Zener diode 70 is provided in the light emitting device 210 and is electrically connected to the lead-frames 211 and 212 respectively by a wire 240d. This can also achieve a highly reliable light emitting device.

The present invention is not to be limited in terms of the particular embodiments described in this application, which are intended as illustrations of specific aspects of the invention. Many modifications and variations of this invention can be made without departing from its spirit and scope, as will be apparent to those skilled in the art. Functionally equivalent methods and apparatuses to those enumerated herein will be apparent to those skilled in the art from the foregoing descriptions. Such modifications and variations are intended to fall within the scope of the invention. Thus, it is to be understood that this invention is not limited to particular methods, reagents, compounds, or compositions described herein, which can, of course, vary. It is also to be understood that the terminology used herein is for the purpose of describing particular embodiments only, and is not intended to be limiting.

What is claimed is:

1. A light emitting device comprising:
    at least one light emitting element including a plurality of semiconductor layers; and
    a light transmissive sealing member covering the at least one light emitting element,
    wherein the light transmissive sealing member comprises a light transmissive sealing resin containing a silicone resin having a siloxane bond scaffold having methyl and phenyl groups as a principal ingredient, and
    wherein the light transmissive sealing resin has a refractive index in a range between 1.50 and 1.51, a durometer type D hardness at 25° C. specified by JIS K 6253 in a range between 48 and 49, and a DMA tan δ-based glass transition temperature (Tg) in a range between 37° C. and 45° C.

2. The light emitting device according to claim 1, wherein the light transmissive sealing member contains a fibrous filler.

3. The light emitting device according to claim 2, wherein the fibrous filler is localized at least near the upper face of the at least one light emitting element.

4. The light emitting device according to claim 1, wherein a current density J [A/cm²] of the at least one light emitting element when energized at 120 mA is 12 or higher.

5. The light emitting device according to claim 1, wherein a peak emission wavelength of the at least one light emitting element is in a range between 380 nm and 500 nm.

6. The light emitting device according to claim 1 further comprising:
    a resin package comprising a plurality of lead-frames and a resin portion, and having a cavity with a bottom surface at which top surfaces of the lead-frames are exposed,
    wherein bottom surfaces of the lead-frames are exposed at a bottom face of the light emitting device,
    wherein the at least one light emitting element is mounted on at least one of the lead-frames, and
    wherein the at least one light emitting element is covered by the sealing resin within the cavity.

7. The light emitting device according to claim 6, wherein the resin portion contains a thermosetting resin.

8. The light emitting device according to claim 7, further comprising:
    at least one lead-frame,
    wherein respective electrodes of the at least one light emitting element and the at least one lead-frame are connected by wires.

9. The light emitting device according to claim 8,
    wherein the resin package is rectangular in shape, so as to have a longitudinal direction and a transverse direction in a top view,
    wherein the at least one light emitting element is rectangular in shape in a top view,
    wherein electrodes of the at least one light emitting element are positioned at corners of an upper face of the at least one light emitting element, and
    wherein the wires extend from the corners of the at least one light emitting element in a direction away from the at least one light emitting element along the longitudinal direction of the resin package.

10. The light emitting device according to claim 1 further comprising:

at least one lead-frame, wherein respective electrodes of the at least one light emitting element and the at least one lead-frame are connected by wires.

11. The light emitting device according to claim 1, wherein a thickness of the light transmissive sealing member above the at least one light emitting element is 350 μm or less.

12. The light emitting device according to claim 1, wherein the sealing resin develops no cracks when driving the light emitting device for 13000 hours at 25° C. when a current density of the at least one light emitting element is 33.8 A/cm$^2$ when calculated using a top view area of an emission region of the semiconductor layers.

13. The light emitting device according to claim 1, wherein the light transmissive sealing member develops no cracks when driving the light emitting device for 1000 hours at 25° C. when a current density of the at least one light emitting element is 98.7 A/cm$^2$ when calculated using a top view area of an emission region of the semiconductor layers.

14. The light emitting device according to claim 1, wherein the light transmissive sealing member effectively contains no wavelength conversion material.

15. The light emitting device according to claim 1, wherein, in a top view, an area of an emission region of the semiconductor layers of the at least one light emitting element is 1 mm$^2$ or smaller.

* * * * *